United States Patent [19]

Saito

[11] Patent Number: 4,525,383

[45] Date of Patent: Jun. 25, 1985

[54] METHOD FOR MANUFACTURING MULTILAYER CIRCUIT SUBSTRATE

[75] Inventor: Tamio Saito, Tokyo, Japan

[73] Assignee: Tokyo Shibaura Denki Kabushiki Kaisha, Kawasaki, Japan

[21] Appl. No.: 415,798

[22] Filed: Sep. 8, 1982

[30] Foreign Application Priority Data

Sep. 11, 1981 [JP] Japan .................. 56-143476
Nov. 30, 1981 [JP] Japan .................. 56-192224
Nov. 30, 1981 [JP] Japan .................. 56-192225

[51] Int. Cl.$^3$ .............................................. B05D 5/12
[52] U.S. Cl. ...................................... 427/89; 427/96; 427/98; 430/314
[58] Field of Search ................. 427/96, 98, 89; 430/314

[56] References Cited

U.S. PATENT DOCUMENTS 3,761,309  9/1973  Schmitter et al. ............... 427/98
4,182,781  1/1980  Hooper et al. .................. 427/98
4,378,384  3/1983  Murakami et al. .............. 427/98

OTHER PUBLICATIONS

A Fabrication Technique for Multilayer Ceramic Modules, Kaiser et al., Solid State Technology, May 1972, pp. 35–40.

Electrolles Gold Plating of Thick Films, Haddad, IBM Technical Disclosure Bulleten, 16(4), 9/73.

Primary Examiner—John E. Kittle
Assistant Examiner—James J. Seidleck
Attorney, Agent, or Firm—Oblon, Fisher, Spivak, McClelland & Maier

[57] ABSTRACT

A method for manufacturing a multilayer circuit substrate includes the step of providing an insulating substrate formed of an inorganic oxide and supporting a laminate formed by alternately laminating wiring layers of copper and insulating layers of an inorganic oxide. The uppermost layer of the laminate is constituted by a copper wiring layer. A layer of electrically conductive material capable of being subjected to wire bonding is formed by a low temperature deposition on the surface of the laminate. Subsequently, the conductive material layer is selectively removed by photoetching to allow the portion connected to part of the uppermost copper wiring layer to remain. In this manner, the pattern layer capable of wire bonding can be formed.

4 Claims, 11 Drawing Figures

METHOD FOR MANUFACTURING MULTILAYER CIRCUIT SUBSTRATE

BACKGROUND OF THE INVENTION

I. Field of the Invention

The present invention relates to a method for manufacturing a multilayer circuit substrate in which wiring layers and insulating layers are alternately laminated on an insulating substrate.

II. Description of the Prior Art

In a conventional multilayer circuit substrate in which wiring layers and insulating layers have been alternately laminated on an insulating substrate formed of ceramics, gold has been used for the wiring layers. Since the gold is expensive, however, it is preferred to employ as wiring layers a less expensive metallic material such as, for example, copper. Usually, a wire bonding process has been employed to bond a lead wire to the uppermost wiring layer in the multilayer circuit substrate. However, the disadvantage to using copper is that the wire bonding process can hardly be applied to copper wiring layers in the multilayer circuit substrate.

The insulating layers of the conventional multilayer circuit substrate have been formed of an organic material, e.g., polyimide. When a semiconductor element such as a large-power LSI was mounted on the multilayer circuit substrate, since such an organic material had improper thermal conductivity, the conventional multilayer circuit substrate which employed the organic material insulating layer had a great drawback in that the heat generated in the semiconductor element could not be rapidly dissipated at its operating time.

SUMMARY OF THE INVENTION

It is an object of the present invention to provide a method which can inexpensively produce a multilayer circuit substrate which has much better heat dissipation characteristics than the conventional multilayer circuit substrate.

According to a method for manufacturing a multilayer circuit substrate of the present invention, an insulating substrate which is formed of an inorganic oxide and which supports thereon a laminate wherein wiring layers formed of copper and insulating layers formed of an inorganic oxide are alternately laminated is employed. The uppermost layer of the laminate is the copper wiring layer. A layer of an electrically conductive material capable of being subjected to a wire bonding process is formed by a low temperature deposition on the surface of the laminate. Subsequently, the conductive material layer is selectively removed by a photoetching method so that the portion connected to part of the copper wiring layer forming the uppermost layer of the laminate remains. In this manner, a pattern layer which is capable of being subjected to wire bonding can be formed.

In the multilayer circuit substrate according to the present invention, substantially all the wiring layers can be formed of copper and the insulating layers between the respective wiring layers are formed of an inorganic oxide. Therefore, the entire circuit substrate can be inexpensively manufactured, and good heat dissipation can be provided at the substrate. In addition, since a conductive material layer which is capable of being subjected to a wire bonding process is formed on the uppermost copper wiring layer, the wire bonding process can be applied to the circuit substrate without fail.

In the present invention, it is important to form the conductive material layer by a low temperature deposition (which will be defined later) and to pattern the conductive material layer by photoetching. The low temperature deposition and photoetching do not produce a brittle alloy between the uppermost copper layer and the conductive material. Further, the photoetching enables a microminiature patterning.

BRIEF DESCRIPTION OF THE DRAWINGS

This invention is best understood by reference to the accompanying drawings, in which.

DETAILED DESCRIPTION OF THE PREFERRED EMBODIMENTS

Figure 1:
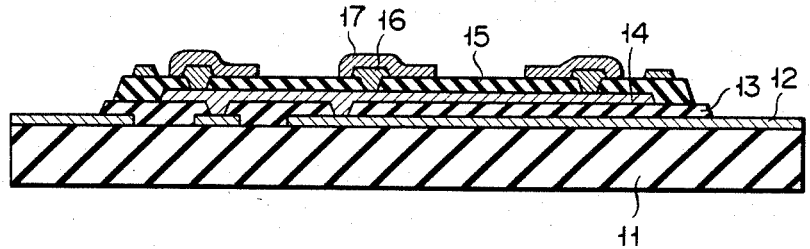
FIG. 1 is a sectional view for explaining one embodiment of a method for manufacturing a multilayer circuit substrate according to the present invention.

The present invention will now be described in more detail with reference to the accompanying drawings. The same portions in the respective drawings are designated by the same or equivalent reference numerals in FIGS. 1 through 4C.

FIG. 1 is a sectional view illustrating one embodiment of a method for manufacturing a multilayer circuit substrate according to the present invention. In this embodiment, copper wiring layers and insulating layers are formed by utilizing a printing of a paste.

As shown in FIG. 1, an insulating substrate 11 which is formed of an inorganic oxide material is first prepared. The inorganic oxide material includes ceramic-based materials (e.g., alumina, and mixtures of the alumina with any of 0.5 to 8 wt. % of other oxides such as boron trioxide, silicon dioxide and lead oxide), and oxide glass materials (e.g., silicon dioxide).

A copper paste and a paste of an inorganic oxide material (e.g., a mixture of alumina and 8 to 80 wt. % of the total sum of silicon dioxide, boron trioxide and lead oxide) are alternately printed on an insulating substrate 11, dried and baked to form copper wiring layers 12, 14 and 16 as well as insulating layers 13 and 15. The baking is carried out in a non-oxidizing and non-reducing atmosphere, i.e., in a neutral atmosphere (e.g., nitrogen gas or argon gas). If the baking is carried out in an oxidizing atmosphere, the copper is oxidized, with the result that the wiring layer formed of the copper does not function as a wiring layer. If the baking is carried out in a reducing atmosphere, the inorganic oxide forming the insulating layers is reduced, with the result that the insulating layer formed of the inorganic oxide does not function as an insulating layer. As shown, the wiring layers 12, 14 and 16 are electrically connected to each other through openings formed at the insulating layers 13 and 15.

Subsequently, a layer of an electrically conductive material which is capable of being subjected to a wire bonding process (i.e., a material which forms a layer to which a lead wire can be bonded by a conventional wire bonding process without fail) such as, for example, gold, silver or aluminum is formed by a low temperature deposition on the surface of the laminate thus obtained. In this specification, "low temperature deposition" means a technique which forms the electrically conductive material layer at a low temperature that does not diffuse the copper forming the wiring layer 16 of the uppermost layer of the laminate in the conductive material or does not alloy the copper with the conductive material, and includes a vapor deposition, a sputtering, an ion plating, a plating (including both an electroless plating and an electrolytic plating) known per se. In case of employing the plating, it is preferred according to the present invention to form by electroless plating a nickel layer on the surface of the laminate prior to the formation of the conductive material layer, and to form an electrically conductive material layer on the nickel layer.

Thereafter, the conductive material layer is photoetched, i.e., a photoresist is formed on the entire surface of the conductive material layer, dried, exposed to light and developed; with the remaining resist used as a mask, the conductive material layer is selectively etched, and a pattern layer 17 connected to the copper wiring layer 16 remains, as shown. This pattern layer 17 becomes a bonding pad of the multilayer circuit substrate thus obtained.

In the embodiment of the method described above, the wiring layers 12, 14, 16 are formed of copper, and are therefore more economical. Since the uppermost wiring layer 16 is covered with the layer 17 capable of being subjected to wire bonding process, no problem occurs in the wire bondability of the final multilayer circuit substrate.

Particularly, the deposition or sputtering for forming the conductive material layer is normally carried out at a low temperature (200° C. or less), the plating is performed at a lower temperature, and the etching step is also carried out at a lower temperature. Therefore, no brittle alloy is formed due to the diffusion between the gold used as the conductive material layer and the copper wiring layer, and the material layer 17 has sufficient strength. The printing and baking of a gold paste can be, for example, considered in the formation of such a conductive material layer, but diffusion between the gold and the copper occurs at a high temperature required to bake the gold paste, resulting in the formation of brittle alloy, which is not preferred as a bonding pad.

In the method of the above embodiment, the insulating layers are formed of an inorganic oxide. Therefore, its heat dissipation is for superior to the organic material, and the insulating layers of the inorganic oxide are well-suited for mounting a large-power semiconductor element.

Since the wiring layers 12, 14 and 16 are formed by printing and baking of the copper paste in the embodiment described above, the thickness of the wiring layers can be increased, a thickening step involving plating is not necessary, and no problem occurs even in the passage of a large current therethrough. In particular, the thick wiring layer formed of the copper paste has features and advantages not only of electrical conductivity, but of preferable solderability and a resistance to solder reaching.

FIGS. 2A to 2E show sectional views for describing another embodiment of the method according to the present invention. In this embodiment, a copper wiring layer at least formed directly on the insulating substrate is formed of a thin copper film.

Figure 2A:
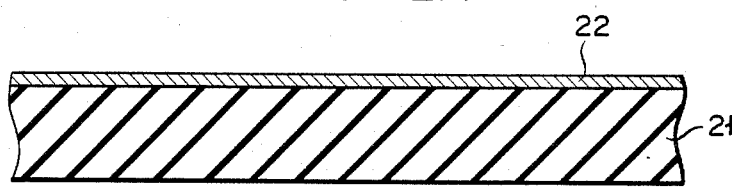
FIGS. 2A to 2E, 3A and 3B and 4A to 4C are sectional views showing different embodiments of the present invention.
Figure 2B:
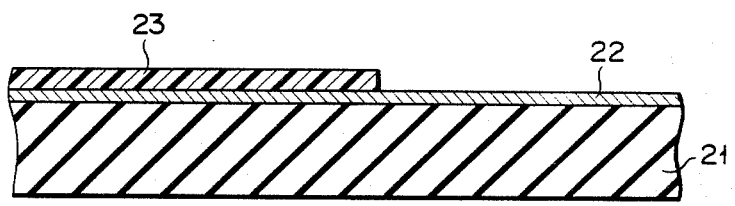

As shown in FIG. 2A, a thin copper film 22 is formed, for example, by vapor deposition, sputtering or plating, in a thickness of about 1 to 20 μm on the overall surface of an insulating substrate 21 similar to the insulating substrate 11. As shown in FIG. 2B, a photoresist is formed on the overall surface of the thin copper layer 22, exposed and developed in a predetermined pattern so as to remove the unnecessary portion is removed therefrom. Using the remaining photoresist 23 as a mask, the thin film 22 is selectively etched and removed. Subsequently, the photoresist 23 is removed, for example, by an oxygen plasma, by baking at a temperature at which the thin film 22 is not oxidized (400° to 500° C., or less), or by a resist stripper.

Figure 2C:
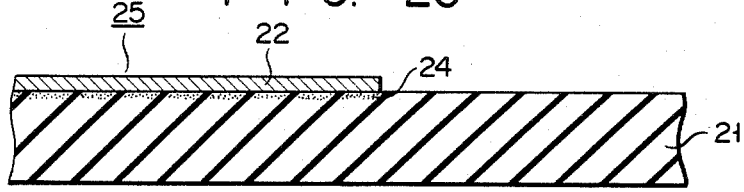

Subsequently, the substrate 22 is heated in the above-described neutral atmosphere at a temperature at which the thin copper film 22 reacts with the inorganic oxide material forming the insulating substrate 22. In the case where the substrate 21 is formed of a material which contains as a main ingredient aluminum oxide ($Al_2O_3$, a copper aluminate 24 is formed, as shown in FIG. 2C, at a temperature in the range from 900° C. to 1,200° C., and the thin copper film 22 is rigidly bonded to the substrate 21. In the case where the substrate 21 is formed of a material which contains as a main ingredient silicon dioxide ($SiO_2$), the thin copper film 22 is similarly rigidly bonded to the substrate 21 at a temperature in the range from 750° C. to 950° C.

In this manner, a wiring pattern layer 25 which is formed of the thin copper layer 22 is formed, as shown in FIG. 2C, on the substrate 21.

Figure 2D:
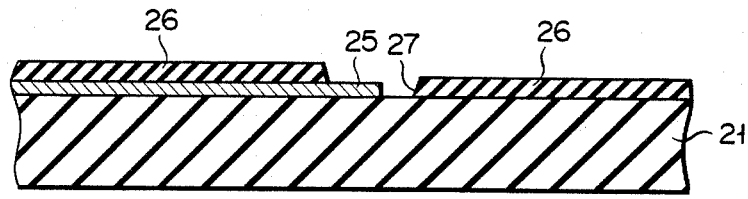
Figure 2E:
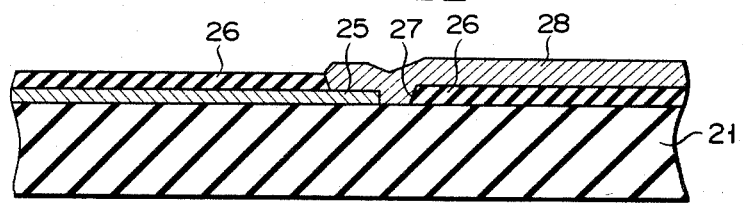

Then, an inorganic oxide material paste is printed in the same manner as described with respect to FIG. 1, then baked in a neutral atmosphere, and an insulating layer 26 which selectively exposes the wiring layer 25 is formed (FIG. 2D). Thereafter, a second wiring layer 28 is formed through the printing of a copper paste and baking in a neutral atmosphere in the same manner as described with respect to FIG. 1. Subsequently, a copper paste and an inorganic oxide material paste are alternately printed and baked as described with respect to FIG. 1, as required to manufacture a substrate for supporting a predetermined laminate. Or, the second wiring layer 28 and the subsequent wiring layer or layers may be formed of thin copper films and may react with the primary insulating layer in the same method as described with reference to FIGS. 2A to 2C.

A bonding pad is formed by the same method as described with reference to FIG. 1 on the uppermost copper wiring layer of the laminate on the substrate 21 thus obtained.

Particularly, in this second embodiment, when the thin copper film is employed as the wiring layer, it is rigidly bonded to the underlying insulating layer or insulating substrate.

Figure 3A:
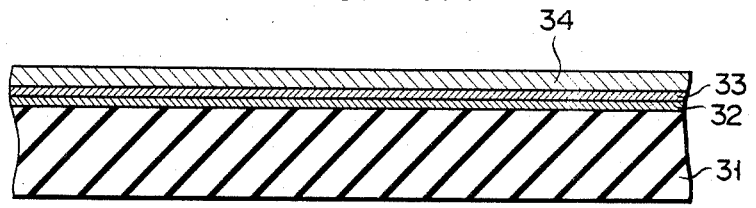
Figure 3B:
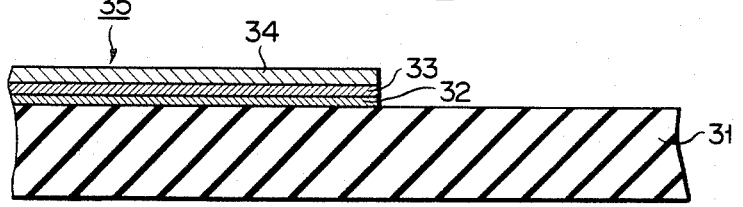

FIGS. 3A and 3B are sectional views for describing still another embodiment of the method according to the present invention. In this third embodiment, a copper wiring layer formed directly on the insulating substrate is formed of a thin copper film.

As shown in FIG. 3A, an adhesive layer 32 and then a film 33 of material capable of forming a stable alloy with copper are formed on an insulating substrate 31, and a thin copper film 34 is covered thereon and formed, for example, by a vapor deposition, sputtering or plating in a thickness of about 1 to 20 μm. The adhesive layer 32 is formed of a metal which has a free energy of formation of oxide larger than that of copper, such as titanium, vanadium, chromium, tungsten or alloys thereof in a thickness of about 200 to 3,000 Å. On the other hand, the film 33 is not always necessary, but is preferred to form a stable alloy with the copper at the subsequent baking time to rigidly bond the thin copper film 34 to the adhesive layer 32. The film 33 is formed, for example, of nickel or palladium.

Subsequently, the films 34, 33 and 32 are selectively removed by photoetching in the same manner as described with reference to FIG. 2A. Thus, a wiring pattern 35 is obtained as shown in FIG. 3B.

Then, an inorganic material paste and a copper paste are alternately printed and baked in the same manner as described with respect to the second embodiment to produce a predetermined laminate, and a bonding pad layer is formed in the same manner as described with reference to FIG. 1 on the uppermost copper wiring layer of the laminate. In the third embodiment described above, all the wiring layers may be formed in a two-layer or three-layer structure of a thin copper layer and an adhesive layer, and, as required, together with a layer forming a stable alloy with copper by the method as described with reference to FIG. 3A.

In this embodiment described above, the adhesive layer is formed of a material which has a free energy of formation of oxide higher than that of copper. Therefore, the adhesive layer and therefore the copper layer can be bonded more rigidly to the substrate.

Figure 4A:
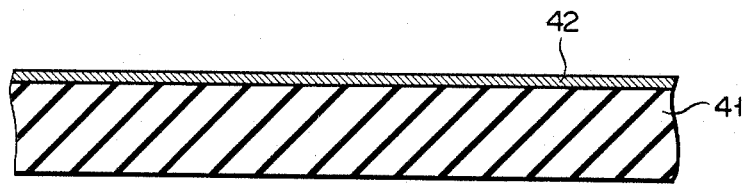
Figure 4B:
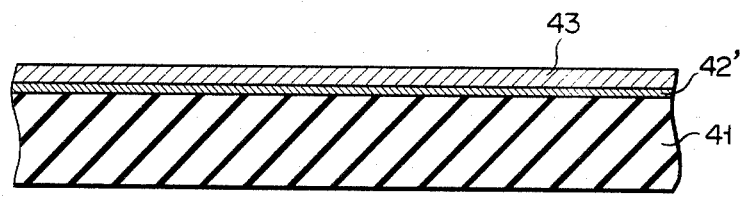
Figure 4C:
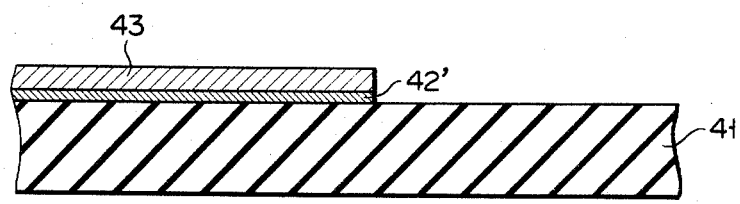

FIGS. 4A to 4C are sectional views for describing still another embodiment of the method according to the present invention. A wiring layer which contacts an insulating substrate is formed of a thin copper film.

As shown in FIG. 4A, the surface of an insulating substrate 41 is cleaned, a first thin copper film 42 is formed, for example, by a vapor deposition, ion plating or sputtering on the suface of the substrate 41 in a thickness of about 100 to 4,000 Å. Subsequently, the first thin copper film 42 is oxidized in oxygen plasma. This can be performed by exciting the oxygen with microwaves and introducing it via a waveguide into a vacuum deposition chamber.

Thus, the first thin copper film 42 is oxidized, and a second thin copper film 43 having a thickness larger than the first thin copper film 42, e.g., 1 to 20 μm, is formed by a vapor deposition, ion plating or sputtering on the copper oxide film 42' as shown in FIG. 4B.

Subsequently, as shown in FIG. 4C, the thin copper film 43 and the copper oxide film 42' are selectively removed by photoetching and baked at a temperature at which the copper oxide 42' reacts with the underlying substrate 41. In this case, the copper oxide 42', which is produced by the oxidation of the first thin copper film 42, has a surface free energy higher than the ordinary bulk state, and accordingly reacts with the substrate 41 at a relatively lower temperature, e.g., 960° C. A spinel type crystal is formed by such baking with the reaction of $CuO-Al_2O_3$ or $CuO-SiO_2$, and the second thin copper film 43 is rigidly bonded to the substrate 41. In this case, the surface of the second thin copper film 43 is not oxidized, and accordingly exhibits a preferable adhesiveness by soldering.

In this manner, a wiring pattern 44 which is formed of a thin copper film is formed, as shown in FIG. 4C, on the substrate 41.

It should be noted that the oxidation of the first thin copper film 42 may be accomplished by baking in an oxidative atmosphere or by treatment with a chemical such as hydrogen peroxide solution, instead of the oxygen plasma. The formation of the first thin copper film 42 may be performed by a chemical plating, and the formation of the second thin copper film 43 may be performed by an electric plating.

Thereafter, a laminate is obtained by an inorganic oxide material paste and a copper paste in the same manner as described with respect to the previous embodiments, and a bonding pad layer is formed on the uppermost copper wiring layer. The respective copper wiring layers may, of course, be formed in accordance with the method as described with reference to FIGS. 4A to 4C.

What is claimed is:

1. A method for manufacturing a multilayer circuit substrate comprising the steps of:

providing an insulating substrate formed of an inorganic oxide;

successively and alternately forming wiring pattern layers and insulating layers on said insulating substrate, each of said wiring pattern layers consisting of a copper layer and an adhesive layer, said adhesive layer being deposited on said insulating substrate and each of said insulating layers and each of said copper layers being deposited on each of said adhesive layers and wherein said adhesive layer comprises a first metallic material having a free energy of a formation of oxide higher than that of copper; and forming, by a low temperature deposition, a layer of an electrically conductive material capable of being subjected to wire bonding of said copper layer.

2. The method according to claim 1, wherein said adhesive layer is formed of titanium, vanadium, chromium, tungsten or an alloy thereof.

3. The method according to claim 1, wherein said metallic material forming the stable alloy with copper is nickel or palladium.

4. The method according to claim 1, further comprising the step of forming a layer of a second metallic material on said adhesive layer for forming a stable alloy with copper.

* * * * *